(12) United States Patent
Pearson

(10) Patent No.: US 7,916,508 B2
(45) Date of Patent: Mar. 29, 2011

(54) SYSTEMS AND METHODS INVOLVING THYRISTORS

(75) Inventor: William Robert Pearson, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 651 days.

(21) Appl. No.: 11/950,866

(22) Filed: Dec. 5, 2007

(65) Prior Publication Data

US 2009/0147555 A1    Jun. 11, 2009

(51) Int. Cl.
    *G01R 15/18* (2006.01)
(52) U.S. Cl. .............................. 363/85; 363/96; 324/127
(58) Field of Classification Search .................... 363/54, 363/57, 58, 85–88, 96, 128–130, 135–139; 324/127
    See application file for complete search history.

(56) References Cited

U.S. PATENT DOCUMENTS

| | | | |
|---|---|---|---|
| 4,475,150 A * | 10/1984 | D'Atre et al. | 363/51 |
| 4,891,741 A | 1/1990 | Slattery et al. | |
| 5,015,945 A | 5/1991 | Radun | |
| 5,239,554 A | 8/1993 | Gensini et al. | |
| 5,604,423 A | 2/1997 | Degeneff et al. | |
| 5,877,691 A * | 3/1999 | Suptitz et al. | 340/638 |
| 5,963,441 A * | 10/1999 | Gibbs et al. | 363/87 |
| 6,043,999 A | 3/2000 | Ehrenberg et al. | |
| 6,603,795 B2 | 8/2003 | Ma et al. | |
| 7,368,890 B2 | 5/2008 | Pande et al. | |
| 2004/0027750 A1* | 2/2004 | Minami et al. | 361/62 |
| 2004/0183522 A1* | 9/2004 | Gunn et al. | 324/126 |

FOREIGN PATENT DOCUMENTS

JP    2001045741 A *  2/2001

* cited by examiner

*Primary Examiner* — Harry Behm
(74) *Attorney, Agent, or Firm* — Cantor Colburn LLP

(57) ABSTRACT

An exemplary embodiment includes a system for measuring and controlling a thyristor comprising a thyristor, a Rogowski coil in operable communication therewith the thyristor, and a processor operative to receive signals from the Rogowski coil, determine a direct current value of the thyristor, and control the thyristor.

17 Claims, 3 Drawing Sheets

US 7,916,508 B2

SYSTEMS AND METHODS INVOLVING THYRISTORS

BACKGROUND

Embodiments relate generally to power semiconductor converters, and more particularly to measuring the current in thyristors and thyristor bridge circuits using Rogowski coils.

In this regard, a variety of measurement schemes have been used to diagnose and control thyristor bridge circuits. Using shunts is one method for diagnosing and controlling thyristor bridge circuits. For control purposes, shunts may be placed on the direct current (dc) output of the thyristor bridge circuit. The shunt wires are often subjected to high voltages. Thus, insulation failures may be prevalent. Shunts also consume large amounts of energy and are prone to overheating.

Another method for diagnosing and controlling thyristor bridge circuits uses iron core alternating current (ac) transformers on the incoming ac busses of the thyristor bridge circuit. To use this method, a cable or bus must be run through the transformers at the time of assembly. Measuring large currents on bus bars also requires large and expensive transformers.

Hall Effect current sensors may also be used to measure current in a thyristor bridge circuit. The Hall Effect current sensors are placed on the incoming ac bus or outgoing dc bus of each power converter. However Hall Effect current sensors do not generally output a highly linear representation of current. Modified versions of Hall Effect current sensors (such as flux balance devices) are capable of linear operation over a specified range. They suffer from greater size and are more expensive than ac current transformers.

Thus, it is desirable to use an apparatus and method for determining the ac and dc current in a thyristor circuit that does not require large or expensive components and outputs a linear representation of current. Additionally, it is desirable to us an apparatus and method that allows the current and voltage outputs of a thyristor circuit to be controlled by a remote processor.

BRIEF DESCRIPTION OF THE INVENTION

An exemplary embodiment includes a system for measuring and controlling a thyristor comprising a thyristor, a Rogowski coil in operable communication therewith the thyristor, and a processor operative to receive signals from the Rogowski coil, determine an alternating current value, a direct current value of the thyristor, and control the thyristor.

An exemplary method includes method for measuring the current in a thyristor, the method comprising integrating a signal received from a Rogowski coil, wherein the Rogowski coil is in operable communication therewith a thyristor, sending the signal to a processor, and processing the signal to determine an alternating current value and a direct current value in the thyristor with the processor.

An alternate exemplary embodiment of a system for measuring and controlling a thyristor bridge circuit comprising, a thyristor bridge circuit including a plurality of thyristors, a Rogowski coil in operable communication therewith a thyristor of the plurality of thyristors, an analog to digital converter operative to receive scaled analog signals from the Rogowski coil and convert the scaled analog signals to a digital format, a serial output unit operative to receive signals from the analog to digital converter and output signals via a first serial link, a processor operative to receive the signals from the serial output unit and determine an alternating current value and a direct current value of the thyristor, and wherein the processor is further operative to control the thyristor, and a thyristor gating unit operative to receive signals from the processor via a second serial link and to send gate firing pulses to the thyristor.

BRIEF DESCRIPTION OF THE DRAWINGS

These and other features, aspects, and advantages will become better understood when the following detailed description is read with reference to the accompanying drawings in which like characters represent like parts throughout the drawings, wherein.

DETAILED DESCRIPTION OF THE DRAWINGS

In the following detailed description, numerous specific details are set forth in order to provide a thorough understanding of various embodiments of the present invention. However, those skilled in the art will understand that some embodiments invention may be practiced without these specific details, that they are not limited to the depicted embodiments. In other instances, well known methods, procedures, and components have not been described in detail.

Further, various operations may be described as multiple discrete steps performed in a manner that is helpful for understanding the described. However, the order of description should not be construed as to imply that these operations need be performed in the order they are presented, or that they are even order dependent. Moreover, repeated usage of the phrase "in an embodiment" does not necessarily refer to the same embodiment, although it may. Lastly, the terms "comprising," "including," "having," and the like, as used in the present application, are intended to be synonymous unless otherwise indicated.

A Rogowski coil is a toroidal coil that may be coupled around a conductor. An alternating magnetic field produced by current in the conductor induces a voltage in the coil proportional to the rate of change of current. Rogowski coils used in a thyristor bridge are relatively efficient and small compared to other types of current measuring devices. They are also easily insulated. These characteristics make using Rogowski coils an attractive method for determining current in a thyristor and other types of power semiconductor converters. The illustrated embodiments show the use of Rogowski coils to determine the ac and dc current in thyristors.

Figure 1:
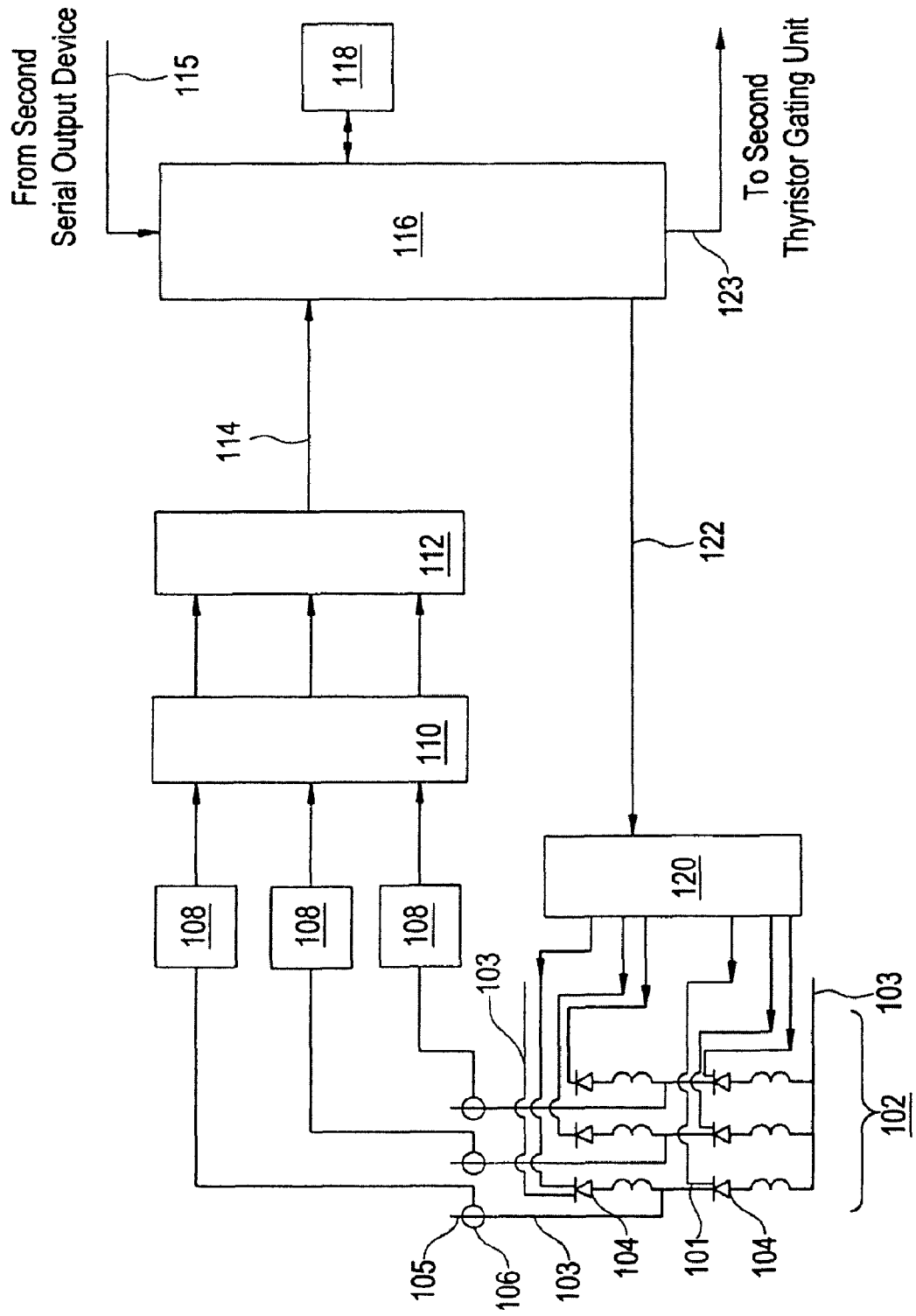
FIG. 1 is a block diagram of an exemplary system for determining the current of a plurality of thyristors.

Referring to FIG. 1, the system 100 includes an exemplary thyristor bridge circuit 102 that comprises thyristors 104 connected to a dc circuit via connections 103. Rogowski coils 106 are coupled to each of the thyristors 104. In the illustrated embodiment, the Rogowski coils 106 are used in a pulsed current position 105 of the thyristors 104 and are connected such that one Rogowski coil 106 may monitor a pair of thyristors 104.

Each of the thyristors 104 may be connected to an integrated amplifier 108. The outputs of the integrated amplifiers 108 are connected to an analog to digital converter 110 that is connected to a serial output device 112. The output of the serial output device 112 is connected to a processor 116 via a serial link 114. The processor 116 may be connected to a memory 118.

The processor 116 is connected to a thyristor gating unit 120 via a serial link 122.

Exemplary methods for measuring the current in a thyristor bridge circuit 102 are described below. In this regard, referring to FIG. 1, the integrated amplifiers 108 receive voltage signals representing current derivatives from the Rogowski coils 106 and send integrated amplified signals to the analog to digital converter 110. The illustrated embodiment uses a delta-sigma method to convert the analog signal to a digital signal, however other embodiments may use any appropriate method for analog to digital conversion of the signal. In some alternate embodiments, the amplitude of the voltage sent by the Rogowski coils 106 may not require amplifying by the integrated amplifiers 108, thus some alternate embodiments may not include the integrated amplifiers 108 but may passively thus partially integrate the signal in preparation for further integration to be performed numerically in the processor 116.

Once amplified, the signals are received by the serial output device 112 and sent to the processor 116 via the serial link 114. In some embodiments, the signals received by the processor 116 may be stored in the memory 118.

The signals received by the processor 116 from the serial link 114 may be further integrated to determine the ac current of the thyristors 104.

In the illustrated embodiment, the processor 116 is connected to the thyristor gating unit 120 with the copper based serial link 122. In alternate embodiments, the processor 116 may be connected to the thyristor gating unit 120 with any appropriate connection such as a fiber optic based serial connection, for example.

The thyristor gating unit 120 is connected to the gate terminals 101 of the thyristors 104. The use of the serial link 122 allows the processor 116 to be located remotely from the thyristor gating unit 120 and the thyristors 104.

The processor 116 may also be used to control a plurality of thyristor circuits via additional thyristor gating units similar to the thyristor gating unit 120 and serial signal inputs similar to the serial link 114. The illustrated embodiment includes a second serial link 123 that is connected to another thyristor gating unit (not shown) that may be similar to the thyristor gating unit 120. A serial link 115 is connected to another serial output device (not shown) may provide signals from another set of Rogowski coils 105 (not shown).

In operation, the Rogowski coils 106 output a derivative of the current (di/dt) flowing through the thyristor 104. Thus, to determine the ac value in the thyristor 104, the signal must be integrated. The integrated signal yields a representation of the actual ac current flowing in the thyristor 104. The signal may be partially integrated by the integrated amplifier 108. The processor 116 may complete the integration of the signal. The illustrated embodiment includes the integrated amplifier 108, however, the in some alternate embodiments, the signal output by the Rogowski coil 106 may not require amplification, but may require scaling. Thus, in alternate embodiments, the amplifier 108 may, for example scale the signal and perform other required signal attenuation.

Figure 2:
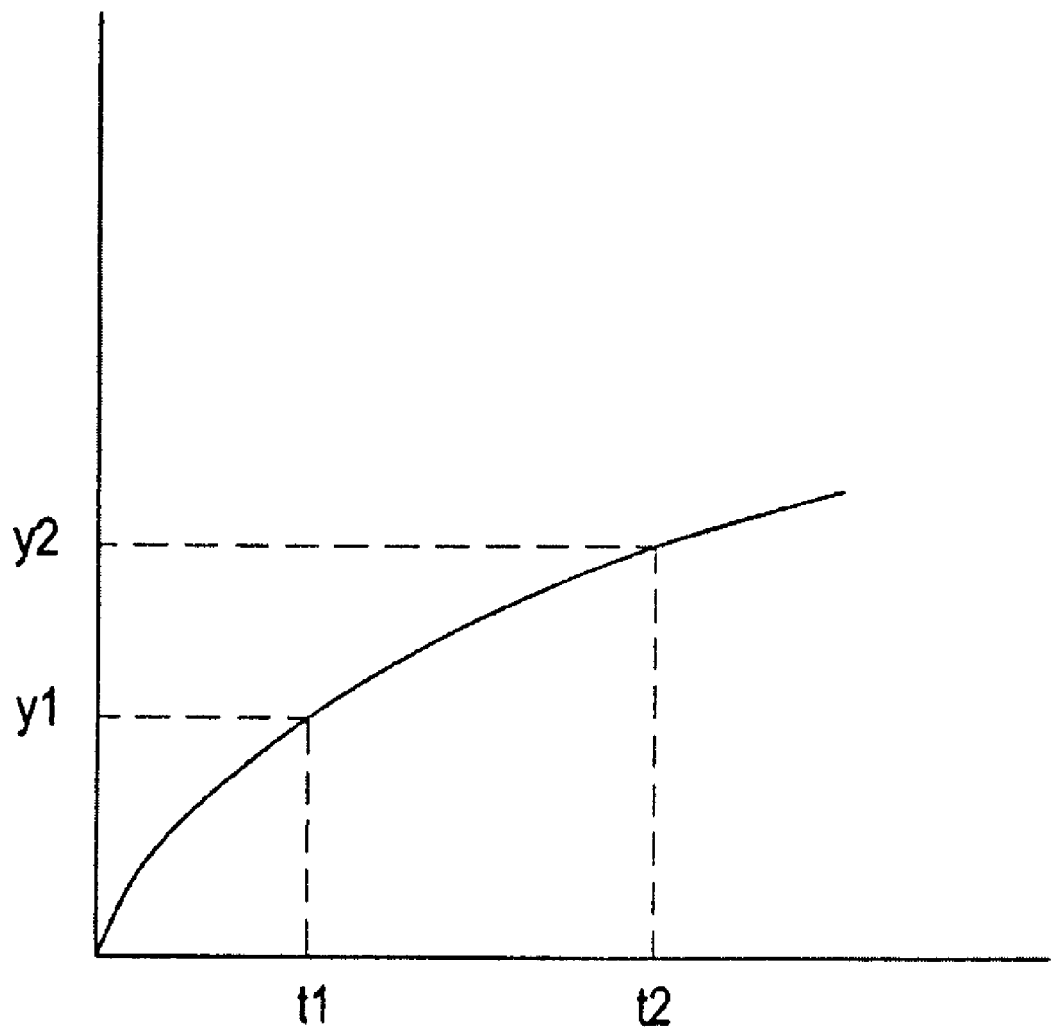
FIG. 2 is a graph illustrating an example of an integrated output current signal.

FIG. 2 illustrates an example of a graph of an integrated output ac current signal. The processor 116 calculates the dc current of the thyristor 104 by sampling a first signal at a time (t1), wherein the first signal is a value (y1). In the illustrated embodiment, y1 is considered a zero current point regardless of the actual measured current at time t1. The processor 116 directs the thyristor 104 to gate at time (t2) and receives a second signal with a value of (y2). The processor 116 then takes the difference between the y2 and y1 values (y2−y1). The resultant difference is the dc current of the thyristor 104.

Figure 3:
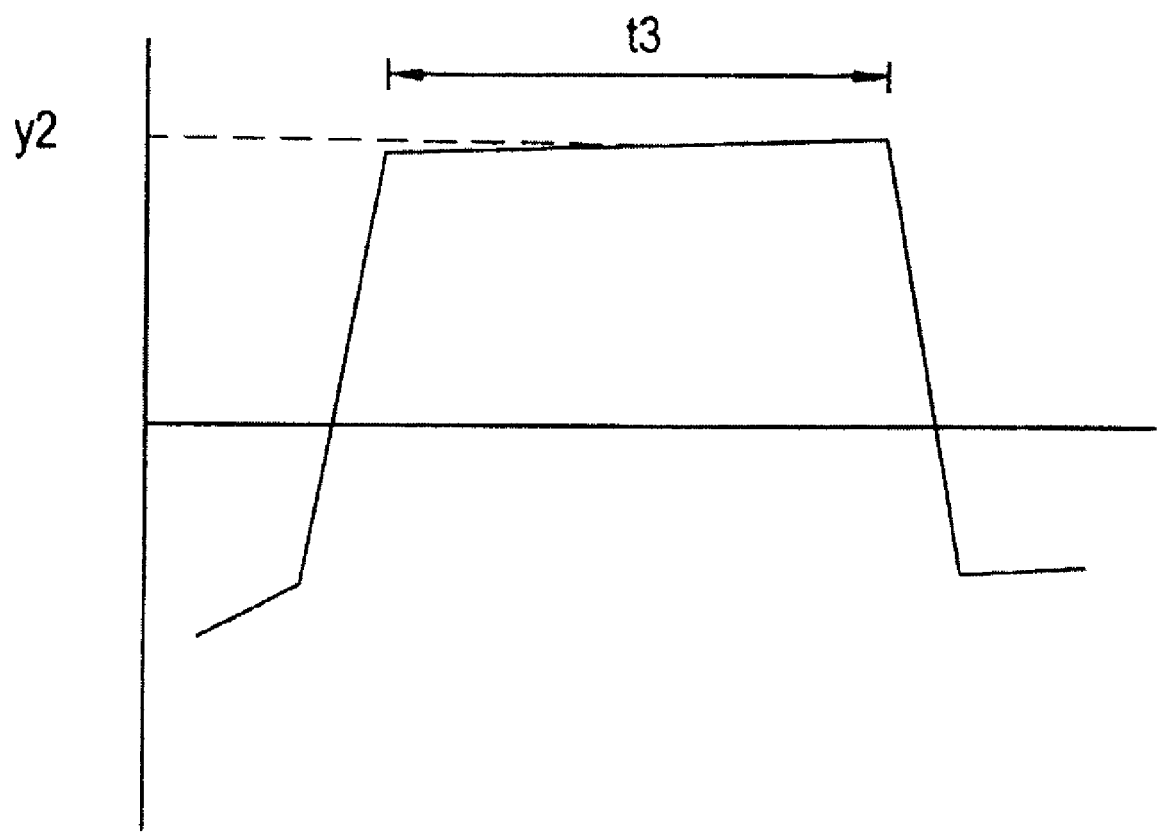
FIG. 3 is a graph illustrating another example of an integrated output current signal.

FIG. 3 illustrates an alternate embodiment of a method that may be implemented by the processor 116 for determining the dc current of the thyristor 104. FIG. 3 includes a graph of an integrated output ac current signal. The second value (y2) may be a calculated average of measurements taken over a conduction interval (t3) of the thyristor. That is, a plurality of measurements spaced in time are acquired by the processor over t3 and averaged to form value y2. The result is a measured value of dc current for the thyristor more representative of actual current.

The processor 116 uses the calculated current and voltage values of the thyristor 104 to determine the appropriate control signals to send to the thyristor gating unit 120. The thyristor gating unit 120 receives the control signals from the processor and generates firing pulses that are sent to the gate terminal 101 of the thyristor 104. The illustrated embodiment includes thyristors 104 that may be controlled by the processor 116, by controlling each of the thyristors 104, the processor may control the thyristor bridge circuit 102. The control may include, for example, actively balancing current, controlling the output voltage, and regulating the current.

This written description uses examples to disclose the invention, including the best mode, and also to enable practice of the embodiments, including making and using any devices or systems and performing any incorporated methods. The patentable scope of the embodiments are defined by the claims, and may include other examples. Such other examples are intended to be within the scope of the claims if they have structural elements that do not differ from the literal language of the claims, or if they include equivalent structural elements with insubstantial differences from the literal languages of the claims.

What is claimed:

1. A system for measuring and controlling a thyristor comprising:
   a thyristor;
   a Rogowski coil in operable communication therewith the thyristor; and
   a processor operative to receive signals from the Rogowski coil, determine a direct current value of the thyristor, and control the thyristor, the processor being operative to determine the direct current of the thyristor by sampling a first signal from the thyristor prior to gating the thyristor, sampling a second signal from the thyristor after gating the thyristor, and calculating a difference between the second signal and the first signal.

2. The system for measuring and controlling a thyristor of claim 1, further comprising a thyristor gating unit operative to receive signals from the processor and to send gate firing pulses to the thyristor.

3. The system for measuring and controlling a thyristor of claim 1, further comprising an integrating amplifier for connecting the Rogowski coil and an analog to digital converter.

4. The system for measuring and controlling a thyristor of claim 3, further comprising:
   a serial output unit operative to receive signals from the integrated amplifier and send signals to the processor via a serial link; and
   a memory operative to store measurements from the Rogowski coil.

5. The system for measuring and controlling a thyristor of claim 1, wherein the processor is operative to determine the direct current of the thyristor by sampling a first signal from the thyristor prior to gating the thyristor and sampling a second signal from the thyristor after gating the thyristor and calculating an average of the second signal and the first signal.

6. The system for measuring and controlling a thyristor of claim 1, further comprising:
- a plurality of thyristors;
- a plurality of Rogowski coils, wherein each of the plurality of Rogowski coils is in operable communication therewith a corresponding thyristor of the plurality of thyristors;
- a plurality of amplifiers each amplifier connected to one of the plurality of Rogowski coils, wherein the plurality of amplifiers are connected to an analog to digital converter and the analog to digital converter is connected to a serial output device, and the processor is operative to receive signals from the serial output device and determine an alternating current value and a direct current value of each of the plurality of thyristors; and
- a thyristor gating unit operative to receive signals from the processor via a serial link, and send gate firing pulses to the plurality of thyristors.

7. The system for measuring and controlling a thyristor of claim 6, wherein the plurality of thyristors are connected in a bridge circuit.

8. A method for measuring the current in a thyristor, the method comprising:
- integrating a signal received from a Rogowski coil, wherein the Rogowski coil is in operable communication therewith a thyristor;
- sending the signal to a processor;
- processing the signal to determine an alternating current value and a direct current value in the thyristor with the processor;
- receiving a first converted signal from the Rogowski coil prior to gating the thyristor;
- receiving a second converted signal from the Rogowski coil after gating the thyristor, wherein determining the direct current voltage of the thyristor includes calculating a difference between the second converted signal and the first converted signal; and
- sending a control signal from the processor to the thyristor.

9. The method for measuring and controlling a thyristor of claim 8, wherein the method further comprises:
- amplifying the signal received from the Rogowski coil; and
- converting the signal from an analog format to a digital format.

10. The method for measuring and controlling a thyristor of claim 8, wherein the method further comprises attenuating the signal received from the Rogowski coil.

11. The method for measuring and controlling a thyristor of claim 8, wherein determining the dc voltage of the thyristor includes calculating an average of the second converted signal and the first converted signal.

12. The method for measuring and controlling a thyristor of claim 8, wherein the method further comprises sending a control signal from the processor to the thyristor via a thyristor gating unit.

13. The method for measuring and controlling a thyristor of claim 8, wherein the method further comprises:
- integrating a signal received from a plurality of Rogowski coils, wherein each of the Rogowski coils is in operable communication therewith one of a plurality of thyristors;
- amplifying a plurality of signals from the Rogowski coils;
- sending the plurality signals to the processor; and
- processing the converted signals to determine an alternating current value and a direct current value of each of the thyristors in the plurality of thyristors with the processor.

14. The method for measuring and controlling a thyristor of claim 13, wherein the method further comprises sending control signals from the processor to a thyristor gating unit via a serial link, wherein the thyristor gating unit is operative to control the plurality of thyristors.

15. The method for measuring and controlling a thyristor of claim 13, wherein the method further comprises:
- receiving the plurality of signals from the analog to digital converter by a serial output device; and
- sending the plurality of signals to the processor via a serial link.

16. A system for measuring and controlling a thyristor bridge circuit comprising:
- a thyristor bridge circuit including a plurality of thyristors;
- a Rogowski coil in operable communication therewith a thyristor of the plurality of thyristors;
- an analog to digital converter operative to receive scaled analog signals from the Rogowski coil and convert the scaled analog signals to a digital format;
- a serial output unit operative to receive signals from the analog to digital converter and output signals via a first serial link;
- a processor operative to receive the signals from the serial output unit and determine an alternating current value and a direct current value of the thyristor, and wherein the processor is further operative to control the thyristor, and to determine the direct current of the thyristor by sampling a first signal from the thyristor prior to gating the thyristor and sampling a second signal from the thyristor after gating the thyristor and calculating a difference between the second signal and the first signal; and
- a thyristor gating unit operative to receive signals from the processor via a second serial link and to send gate firing pulses to the thyristor.

17. The system for measuring and controlling a thyristor bridge circuit of claim 16, wherein the system further comprises:
- a third serial link operative to receive signals from a Rogowski coil coupled to a second bridge circuit and send the signals to the processor; and
- a fourth serial link operative to send signals from the processor to a second thyristor gating unit operative to send gate firing pulses to the second bridge circuit.

* * * * *